(12) United States Patent
Lee

(10) Patent No.: US 10,516,119 B2
(45) Date of Patent: Dec. 24, 2019

(54) FLEXIBLE DISPLAY DEVICE

(71) Applicant: Samsung Display Co., Ltd., Yongin-si, Gyeonggi-do (KR)

(72) Inventor: Sangwol Lee, Yongin-si (KR)

(73) Assignee: Samsung Display Co., Ltd., Yong-si (KR)

( * ) Notice: Subject to any disclaimer, the term of this patent is extended or adjusted under 35 U.S.C. 154(b) by 0 days.

(21) Appl. No.: 15/378,709

(22) Filed: Dec. 14, 2016

(65) Prior Publication Data

US 2017/0194580 A1     Jul. 6, 2017

(30) Foreign Application Priority Data

Dec. 30, 2015  (KR) .......................... 10-2015-0189841

(51) Int. Cl.
*H01L 51/00* (2006.01)
*H01L 51/52* (2006.01)

(52) U.S. Cl.
CPC ...... *H01L 51/0097* (2013.01); *H01L 51/5253* (2013.01); *H01L 51/5256* (2013.01); *H01L 2251/5338* (2013.01); *Y02E 10/549* (2013.01)

(58) Field of Classification Search
CPC ..... B23K 26/38; B29C 53/063; G06F 1/1681; G06F 1/1616; B65D 85/00; B21D 31/04; Y10T 428/13; H01L 51/0097; H01L 27/3262; H01L 51/5253; H01L 51/5256; H01L 2251/5338; Y02E 10/549
See application file for complete search history.

(56) References Cited

U.S. PATENT DOCUMENTS

| | | | |
|---|---|---|---|
| 9,562,380 B2 * | 2/2017 | Song | |
| 9,625,947 B2 * | 4/2017 | Lee | G06F 1/1616 |
| D788,734 S * | 6/2017 | Park | D14/138 AB |
| 9,947,726 B2 | 4/2018 | Lee | |
| 2012/0002360 A1 | 1/2012 | Seo et al. | |
| 2012/0307423 A1 * | 12/2012 | Bohn | G06F 1/1641 361/679.01 |
| 2013/0216740 A1 * | 8/2013 | Russell-Clarke | B23K 26/38 428/33 |
| 2014/0226275 A1 * | 8/2014 | Ko | G06F 1/1626 361/679.27 |
| 2014/0362513 A1 | 12/2014 | Nurmi | |

(Continued)

FOREIGN PATENT DOCUMENTS

| KR | 10-2012-0002084 | 1/2012 |
|---|---|---|
| KR | 10-2014-0118222 | 10/2014 |

(Continued)

*Primary Examiner* — Abhishek M Rathod
(74) *Attorney, Agent, or Firm* — Lewis Roca Rothgerber Christie LLP

(57) ABSTRACT

A flexible display device includes a flexible display panel having a folding area adapted to be folded with respect to an imaginary folding line extending across the flexible display panel in a first direction, a driver electrically connected to the flexible display panel, and a protection film on the folding area of the flexible display panel. The protection film has a first surface facing the flexible display panel and a second surface opposite to the first surface. The flexible display device includes a folding reinforcer on the protection film in an area of the folding area having one or more discontinuous portions.

15 Claims, 8 Drawing Sheets

(56) References Cited

U.S. PATENT DOCUMENTS

| 2015/0022090 | A1 | 1/2015 | Kim |
| 2015/0049428 | A1* | 2/2015 | Lee ............... G06F 1/1652 361/679.27 |
| 2015/0208522 | A1 | 7/2015 | Kim et al. |
| 2016/0172623 | A1* | 6/2016 | Lee ............... H01L 51/5253 257/40 |
| 2016/0195901 | A1* | 7/2016 | Kauhaniemi ........ G06F 1/1652 361/679.27 |

FOREIGN PATENT DOCUMENTS

| KR | 10-2015-0011230 | | 1/2015 |
| KR | 10-2015-0087706 | | 7/2015 |
| KR | 10-2015-0096946 | | 8/2015 |
| KR | 10-2017-0001819 | A | 7/2017 |

* cited by examiner

FLEXIBLE DISPLAY DEVICE

CROSS-REFERENCE TO RELATED APPLICATION

This application claims priority to and the benefit of Korean Patent Application No. 10-2015-0189841, filed on Dec. 30, 2015, in the Korean Intellectual Property Office, the content of which is incorporated herein in its entirety by reference.

BACKGROUND

1. Field

One or more embodiments relate to a flexible display device.

2. Description of the Related Art

In general, a display device may be used in mobile apparatuses such as a smart phone, a laptop computer, a digital camera, a camcorder, a mobile information terminal, and a tablet personal computer, and electronic apparatuses such as a desktop computer, a TV set, an outdoor advertisement panel, and an exhibition display device.

Recently, slimmer display devices have been released.

A flexible display device is easy to carry and may be applicable to apparatuses with various shapes. The flexible display device based on an organic light emitting display technology may be one of the most attractive flexible display devices.

The flexible display device may include a curved-type display device, a bending-type display device, a folding-type display device, and a roll-type display device. It is desirable to reduce bending stiffness when the flexible display device is curved, bent, folded, or rolled.

SUMMARY

One or more embodiments include a flexible display device.

Additional aspects will be set forth in part in the description which follows and, in part, will be apparent from the description, or may be learned by practice of the presented embodiments.

According to an aspect of the present inventive concept, a flexible display device may include: a flexible display panel having a folding area adapted to be folded with respect to an imaginary folding line extending across the flexible display panel in a first direction; a driver electrically connected to the flexible display panel; and a protection film (or protection layer) on the folding area of the flexible display panel. The protection film has a first surface facing the flexible display panel and a second surface opposite to the first surface. The flexible display device may include a folding reinforcement unit (or reinforcer) on the protection film in an area of the folding area having one or more discontinuous portions.

According to an embodiment, the one or more discontinuous portions may be separated by a plurality of folding holes (or openings) in the folding area.

According to an embodiment, the plurality of folding openings may transpierce the protection film.

According to an embodiment, each of the folding openings may extend in the first direction.

According to an embodiment, each of the folding openings may have a strip shape.

According to an embodiment, at least one edge of each of the folding openings may be rounded.

According to an embodiment, the plurality of folding openings may include a plurality of first folding openings separate from each other in a second direction crossing the first direction and a plurality of second folding openings that are each between every two adjacent first folding openings in the second direction, in which the plurality of first folding openings and the plurality of second folding openings may be alternatively arranged with respect to each other.

According to an embodiment, the folding openings may be wrapped around by a molding unit (or molded portion).

According to an embodiment, the molded portion may be insert-molded onto the protection film having the folding openings thereon.

According to an embodiment, the molded portion may include a plurality of protrusion units (or protrusions) that protrude from the protection film.

According to an embodiment, each protrusion may include: a bottom portion being contacting the protection film and being at least partially embedded in the folding opening; a top portion positioned away from the protection film; and a side portion connecting the bottom and top portions to each other.

According to an embodiment, a side surface of each protrusion may include an inclined surface.

According to an embodiment, a cross-section of the protrusion may be narrower in a direction away from the bottom portion contacting the protection film than at the bottom portion.

According to an embodiment, the molded portion may include a polymer.

According to an embodiment, each of the folding openings may be circular, elliptical, wavy, or rectangular.

According to an embodiment, the folding reinforcer may include a plurality of dimples (or depressions) in the folding area.

According to an embodiment, the protection film may include a metal film.

According to an embodiment, the flexible display panel may include an outwardly-foldable display panel.

According to an embodiment, the protection film may be on the inside surface of the flexible display panel which is foldable.

According to an embodiment, the flexible display panel may include an active area adapted to display an image, an inactive area that outwardly extends from the active area, a display substrate, and a thin film encapsulation layer on the display panel, in which the thin film encapsulation layer may be on a first surface of the display substrate and the protection film may be on a second surface of the display substrate opposite to the first surface of the display substrate.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
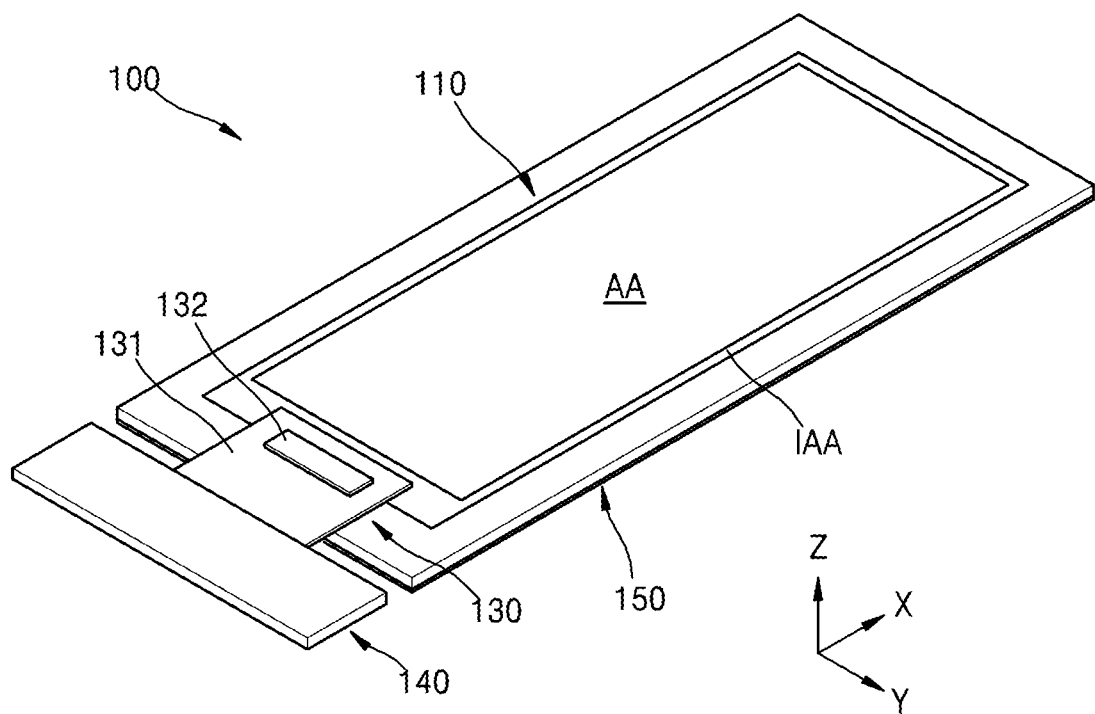
FIG. 1 is a perspective view of a flexible display device according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions or embodiments set forth herein. Accordingly, the embodiments are merely described below, by referring to the figures, to explain aspects of the present description. In the drawings, the relative sizes of elements, layers, and regions may be exaggerated for clarity. Expressions such as "at least one of," when preceding a list of elements, modify the entire list of elements and do not modify the individual elements of the list.

As the inventive concept allows for various changes and numerous embodiments, exemplary embodiments will be illustrated in the drawings and described in detail in the written description. However, this is not intended to limit the inventive concept to particular modes of practice, and it is to be appreciated that all changes, equivalents, and substitutes that do not depart from the spirit and technical scope of the inventive concept are encompassed in the inventive concept. In the description of the inventive concept, certain detailed explanations of the related art are omitted when it is deemed that they may unnecessarily obscure the essence of the inventive concept.

It will be understood that although the terms "first", "second", etc., may be used herein to describe various elements, components, areas, regions, layers and/or sections, these elements, components, areas, regions, layers, and/or sections should not be limited by these terms. These terms are used to distinguish one element, component, area, region, layer or section from another element, component, area, region, layer or section. Thus, a first element, component, area, region, layer or section described below could be termed a second element, component, area, region, layer or section, without departing from the spirit and scope of the present invention.

The terminology used herein is for the purpose of describing particular embodiments only and is not intended to limit the present invention. As used herein, the singular forms "a" and "an" are intended to include the plural forms as well, unless the context clearly indicates otherwise. It will be further understood that the terms "comprises," "comprising," "includes," and "including" used herein specify the presence of stated features or components, but do not preclude the presence or addition of one or more other features, components, integers, steps, operations, elements, and/or groups thereof. As used herein, the term "and/or" includes any and all combinations of one or more of the associated listed items.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices (e.g., a driver, a circuit board, etc.) and/or any other relevant devices or components according to embodiments of the present invention described herein may be implemented utilizing any suitable hardware, firmware (e.g., an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

The inventive concept will now be described more fully with reference to the accompanying drawings, in which embodiments of the inventive concept are shown. Like reference numerals in the drawings denote like elements, and thus their repetitive description will be omitted.

Figure 2:
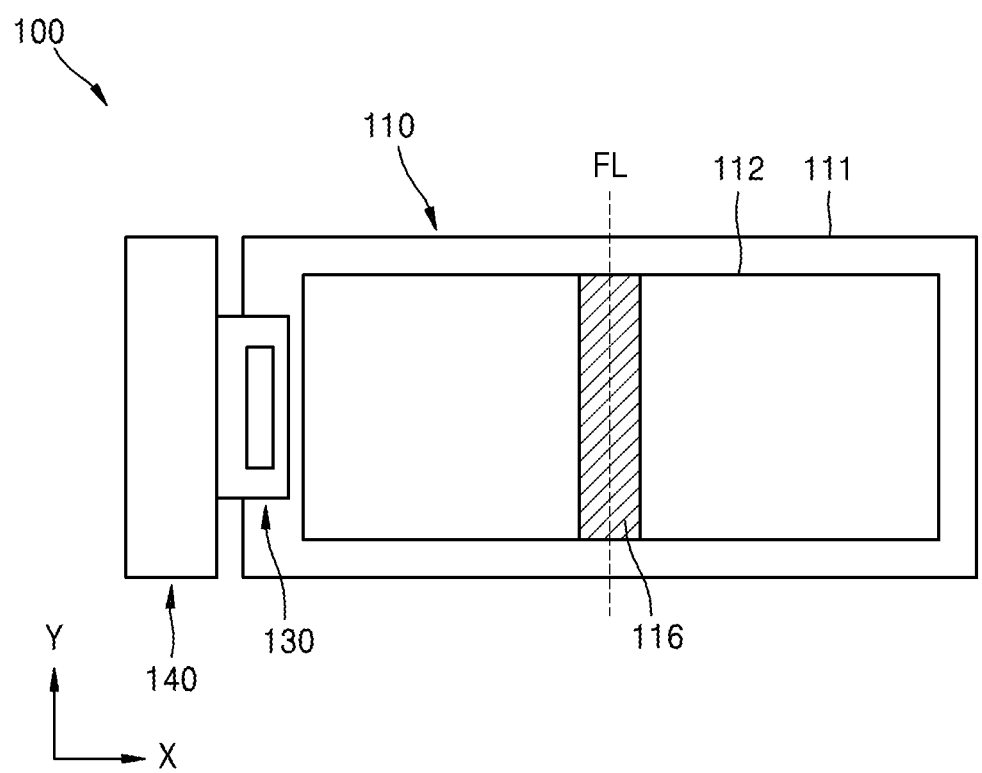
FIG. 2 is a plan view of FIG. 1.
Figure 3:
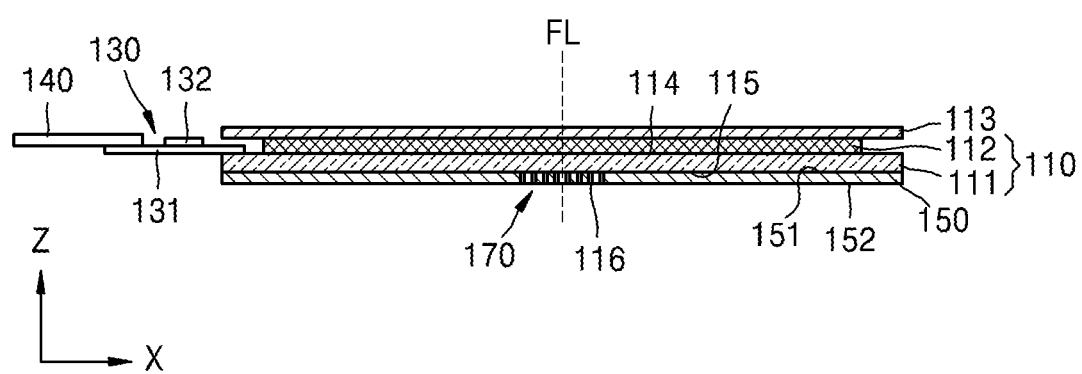
FIG. 3 is a cross-sectional view of FIG. 1.
Figure 4:
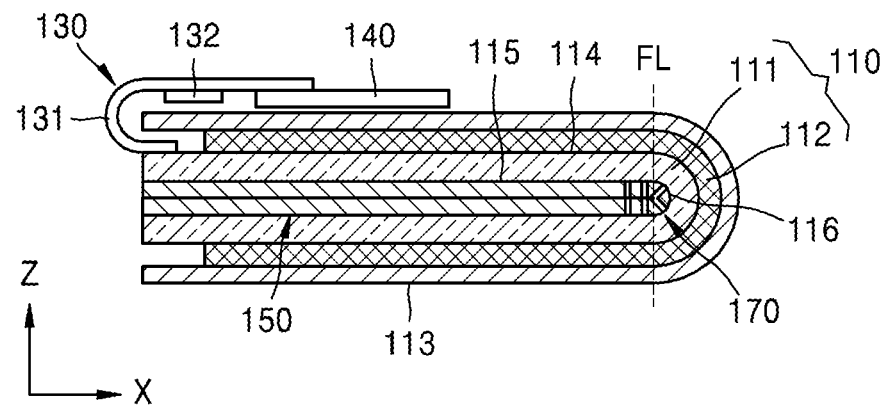
FIG. 4 is a cross-sectional view illustrating a folded state of the flexible display device of FIG. 1.

FIG. 1 is a perspective view of a flexible display device 100 according to an embodiment, FIG. 2 is a plan view of FIG. 1, FIG. 3 is a cross-sectional view of FIG. 1, and FIG. 4 is a cross-sectional view illustrating a folded state of the flexible display device 100 of FIG. 1.

Referring to FIGS. 1 through 4, the flexible display device 100 may include a flexible display panel 110, a driver 130 electrically connected to the flexible display panel 110, and a protection film (or protection layer) 150 on the flexible display panel 110.

According to an embodiment, the flexible display device 100 is described as an organic light emitting display device (or an organic light emitting device (OLED) display device) as an example; however, the flexible display device 100 may be a liquid crystal display (LCD), a field emission display (FED), an electronic paper display (EDP), or any other suitable display known to those skilled in the art.

The flexible display panel 110 may include an active area (AA) displaying (or configured to display) an image and an inactive area (IAA) that outwardly extends from the AA. The IAA may surround the AA according to an embodiment.

According to an embodiment, the AA may extend in a longitudinal direction (an x-axis) of the flexible display panel 110; however, the AA is not limited thereto. For example, the AA may be separate and disposed in (or arranged or positioned in) the longitudinal direction of the flexible display panel 110.

As illustrated in FIGS. 2 through 4, the flexible display panel 110 may include a display substrate 111 including a plurality of elements and a thin film encapsulation layer 112 on the display substrate 111.

As illustrated in FIGS. 3 and 4, the display substrate 111 may include a first surface 114 and a second surface 115 opposite to the first surface 114. The thin film encapsulation layer 112 may be on the first surface 114. The protection film 150 may be on the second surface 115.

The display substrate 111 may include a flexible material, for example, polyimide (PI). The display substrate 111 may include at least one thin film transistor (TFT) and at least one light emitting diode connected to the TFT. A detailed description of this configuration according to an embodiment will be given with respect to FIG. 12.

The thin film encapsulation layer 112 may cover the AA. The thin film encapsulation layer 112 may include at least one of a functional film or layer 113 such as a polarized panel, a touch screen, and a cover window.

The driver 130 may include a driver circuit and have a chip on film (COF) structure. The driver 130 may include a flexible film 131 and a driver integrated circuit (IC) 132 on the flexible film 131. A driver terminal (not illustrated) which is connected to the flexible display panel 110 may be disposed on (or arranged or positioned on) one edge of the flexible display film 131. The driver terminal may be electrically connected to a pad terminal (not illustrated) of the display substrate 111, for example, on the first surface 114 of the display substrate 111.

The driver 130 may include a chip on plastic (COP) or a chip on glass (COG); however, the driver 130 is not limited thereto. The driver 130 may have a structure in which the plurality of driver terminals are disposed on the flexible film 131.

The driver 130 may be electrically connected to a circuit board 140. The circuit board 140 may be a flexible printed circuit board (FPCB).

The flexible display panel 110 may be folded, curved, bent, and/or rolled in at least one direction. As used herein in accordance with an embodiment, the term "folded" may mean folded, foldable, or adapted to be folded as dictated by the context in which the term is used. The flexible display panel 110 may include a folding area 116.

The folding area 116 may be disposed at (or arranged or positioned at) the center of the flexible display panel 110 with respect to the longitudinal (the x-axis) direction of the flexible display panel 110. As used herein, the term "center" is not limited to a precise center point, but rather is intended to account for deviations that persons of ordinary skill in the art will readily recognize and appreciate do not materially alter the function of the flexible display panel 110. The folding area 116 may extend across a width (a y-axis) direction of the flexible display panel 110. The width (the y-axis) direction of the flexible display panel 110 may be a direction that crosses (e.g., by intersecting with) the longitudinal (the x-axis) direction of the flexible display panel 110 according to an embodiment.

The folding area 116 may display an image; however, the folding area 116 is not limited thereto, and the folding area 116 may be variously modified such that a circuit area, a wiring area, etc. may be disposed (e.g., partially or wholly disposed, arranged, or positioned) in the folding area 116 according to an embodiment.

The folding area 116 may be disposed on at least one area of the flexible display panel 110 depending on a location at which the flexible display panel 110 is folded according to an embodiment. For example, the folding area 116 may be disposed on or in a plurality of areas (e.g., more than two areas) in the longitudinal (the x-axis) direction of the flexible display panel 110.

The flexible display device 100 may be folded based on (e.g., along) an imaginary (e.g., invisible) folding line (FL) on the folding area 116. The FL may extend across the width (the y-axis) direction of the flexible display panel 110.

The flexible display panel 110 may be an outwardly-foldable display panel according to an embodiment. The outwardly-foldable type flexible display panel 110 may have the AA displaying an image (e.g., a pictorial and/or textual graphic) toward the outside of the flexible display panel 110. An image or picture of the flexible display panel 110 may be viewed even while the flexible display panel 110 is folded. When the flexible display panel 110 is outwardly folded as illustrated in FIG. 4, folded surfaces of the display substrate 111 may face each other.

The protection film 150 may be disposed on the flexible display panel 110 to support the flexible display panel 110. The protection film 150 may be disposed on the inside of the folded flexible display panel 110.

The protection film 150 may include a first surface 151 facing the flexible display panel 110 and a second surface 152 opposite to the first surface 151. The first surface 151 of the protection film 150 may be on the second surface 115 of the display substrate 111. An adhesive layer or film (not illustrated) may be disposed between the second surface 115 of the display substrate 111 and the first surface 151 of the protection film 150.

The protection film 150 may include or be formed from a material having a Young's modulus that is greater than 50 GPa to prevent a defect such as buckling. The protection film 150 may include or be formed from a metal film. However, when the protection film 150 includes or is manufactured of a material with a high Young's modulus (e.g., a Young's modulus greater than 50 GPa), bending stiffness of the flexible display apparatus 100 may increase.

A folding reinforcement unit (or reinforcer) 170 may be disposed on the protection film 150 to decrease bending stiffness. The folding reinforcement unit 170 may be on the folding area 116. The folding reinforcement unit 170 may be formed via piercing (e.g., cutting) at least a portion of the folding area 116. The folding reinforcement unit 170 may be on the protection film 150 in an area of the folding area 116 having one or more discontinuous portions.

Figure 5:
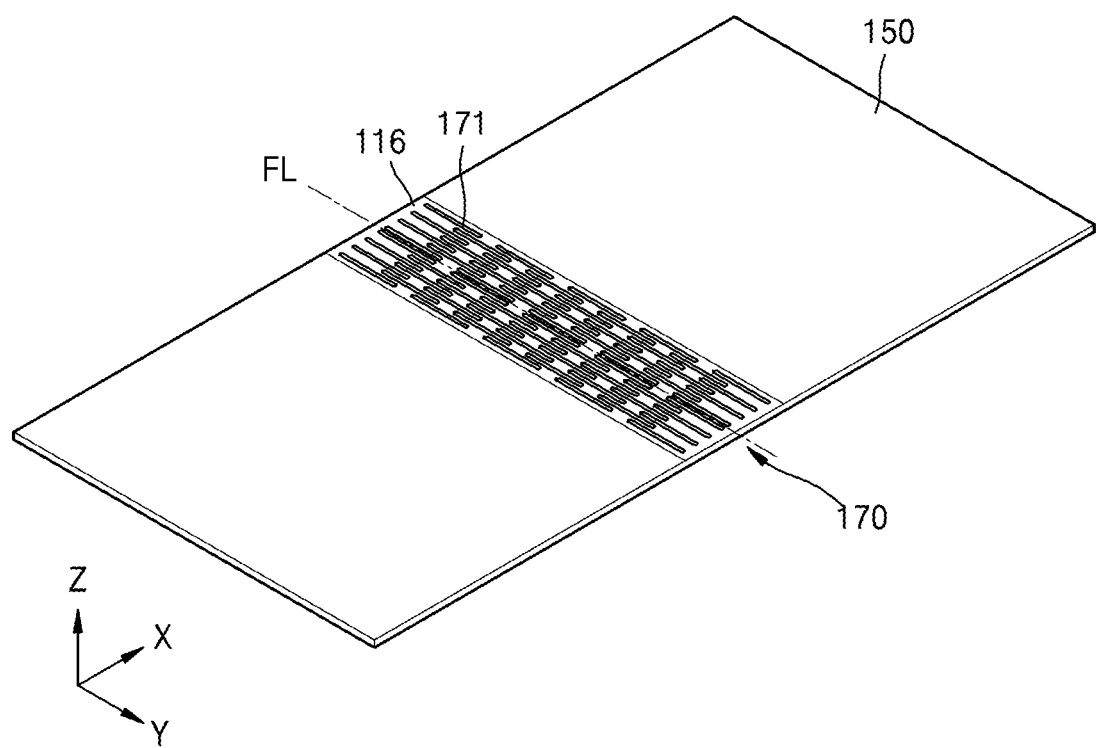
FIG. 5 is a perspective view of a protection film in FIG. 1.
Figure 6:
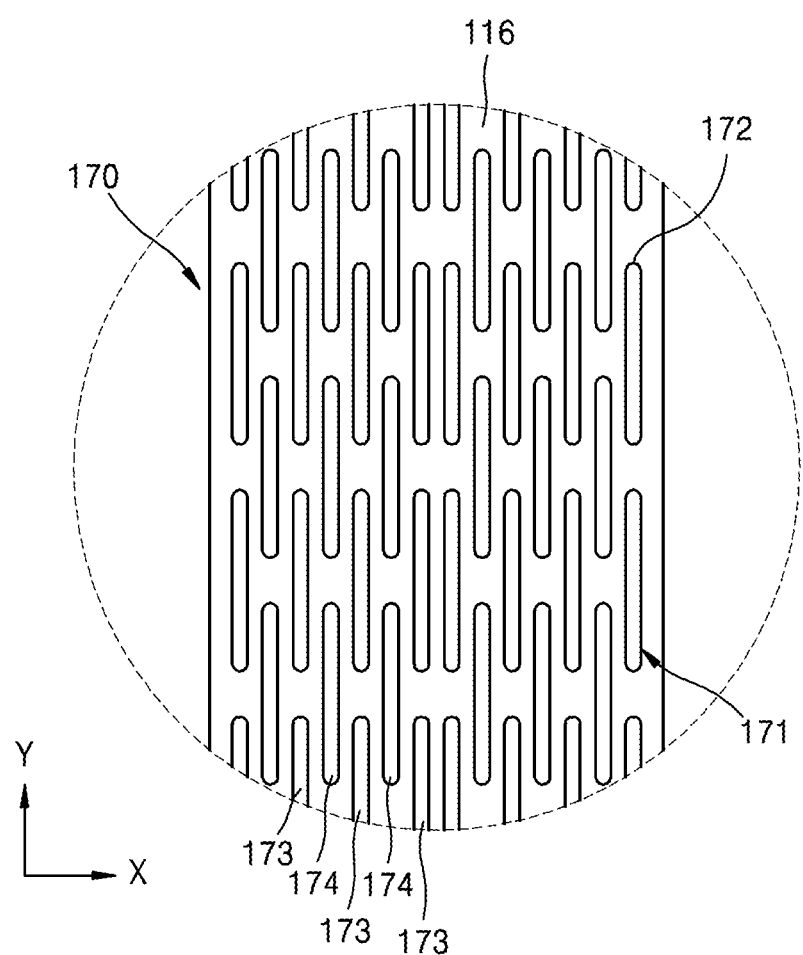
FIG. 6 is an enlarged plan view of a folding area in FIG. 5.

FIG. 5 is a perspective view of the protection film 150 in FIG. 1, and FIG. 6 is an enlarged plan view of the folding area 116 in FIG. 5.

Referring to FIGS. 5 and 6, the protection film 150 may include the folding area 116. The folding area 116 may be disposed at the center of the protection film 150 with respect to the longitudinal (the x-axis) direction of the protection film 150. The protection film 150 may be folded based on (e.g., along) the FL.

The folding reinforcement unit 170 may be disposed on the folding area 116. The folding reinforcement unit 170 may include a plurality of folding holes (or openings) 171 in the folding area 116. The plurality of folding holes 171 may transpierce (e.g., partially or completely) the protection film 150 and/or create a plurality of discontinuous portions separated by the folding holes 171. Each folding hole 171 may extend in the width (the y-axis) direction, crossing the longitudinal (the x-axis) direction thereof, with respect to which the protection film 150 is folded.

Each folding hole 171 may have a strip shape. As illustrated in FIG. 6, a round (or rounded) area 172 may be disposed on one or more edges of each folding hole 171. In some instances, when a pointed shape (e.g., a non-rounded shape) such as a notch exists on one or more edges of each folding hole 171, the protection film 150 may experience a crack or a deformation due to fatigue during folding. Thus, one or more edges of each folding hole 171 may be round (or rounded) to eliminate the pointed shape such as the notch.

The plurality of folding holes 171 may be disposed in various patterns on the folding area 116. According to an embodiment, the plurality of folding holes 171 may include a plurality of first folding holes 173 separate from each other (e.g., formed or arranged as discrete holes or openings) in a folding (the x-axis) direction of the protection film 150 and a plurality of second folding holes 174 that are each between (e.g., arranged or positioned between) two adjacent or neighboring first folding holes 173 with respect to the folding (the x-axis) direction (e.g., between every set of two adjacent or neighboring first folding holes 173 or between a portion of sets of adjacent or neighboring first folding holes 173). The plurality of first folding holes 173 and the plurality of second folding holes 174 may be respectively disposed separate from each other (e.g., formed, arranged, or positioned as discrete holes or openings) in a direction (the y-axis direction) that crosses (e.g., is perpendicular to) the folding direction of the protection film 150.

The plurality of first folding holes 173 and the plurality of second folding holes 174 may be alternately arranged. For example, each row of the plurality of first folding holes 173 and an adjacent row of the plurality of second folding holes 174 may be disposed in (e.g. to collectively form) a zigzag shape.

When the folding reinforcement unit 170 is disposed on the folding area 116, bending stiffness may be reduced. In an embodiment, because the folding area 116 is an area on which the plurality of folding holes 171 are formed, a second moment of folding area 116 (e.g., a level, measurement, or value of torque) causing one or more repulsive force may be reduced. Accordingly, a folding repulsive force of the flexible display panel 110 may be reduced.

Figure 7:
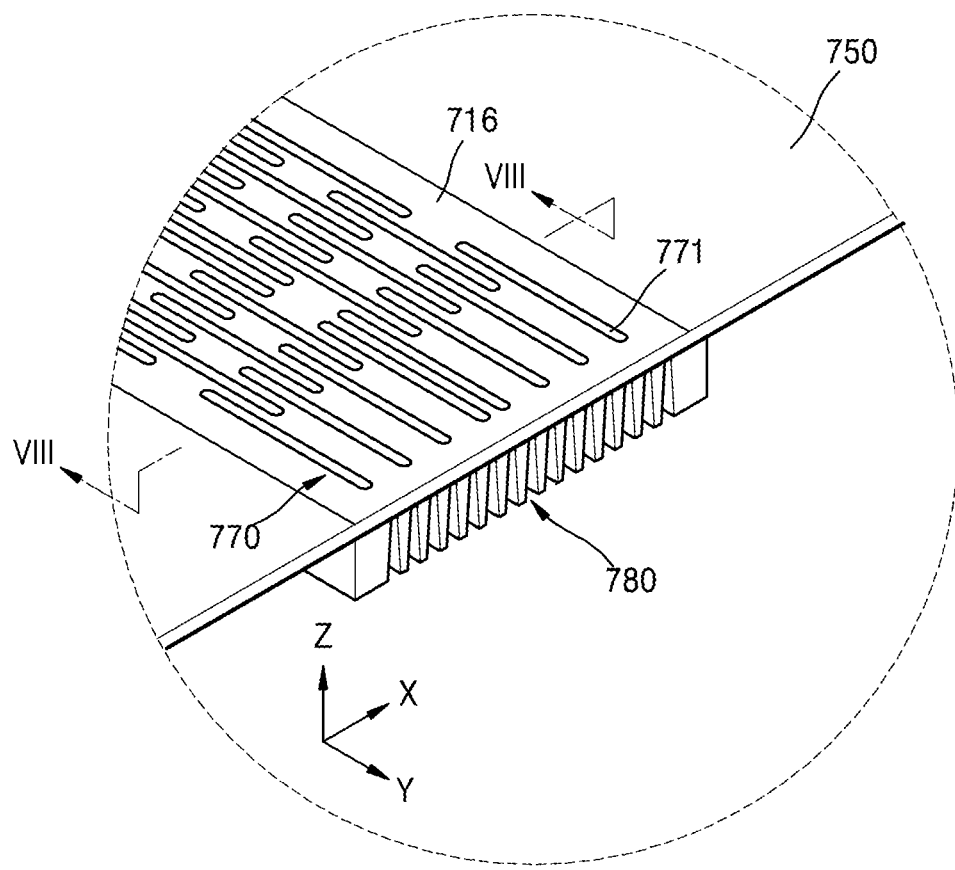
FIG. 7 is a perspective view illustrating a portion of a protection film according to an embodiment.
Figure 8:
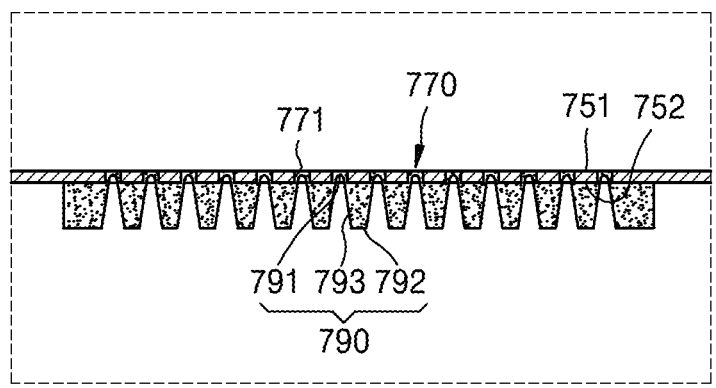
FIG. 8 is a cross-sectional view, taken along the line VIII-VIII in FIG. 7.

FIG. 7 is a perspective view illustrating a portion of a protection film 750 according to an embodiment, and FIG. 8 is a cross-sectional view, taken along the line VIII-VIII in FIG. 7.

Referring to FIGS. 7 and 8, the protection film 750 may, as illustrated in FIG. 8, include a first surface 751 facing the flexible display panel (illustrated as flexible display panel 110 in FIG. 1) and a second surface 752 opposite to the first surface 751.

The protection film 750 may, as illustrated in FIG. 7, include a folding area 716. The folding area 716 may be disposed at the center of the protection film 750 with respect to the longitudinal (the x-axis) direction of the protection film 750. In an embodiment, the folding area 716 may be arranged or positioned at a location other than the center of the protection film 750 with respect to the longitudinal (the x-axis) direction of the protection film 750.

The folding area 716 may include a folding reinforcement unit 770. The folding reinforcement unit 770 may include a plurality of folding holes (or openings) 771 in the folding area 716. The plurality of folding holes 771 may transpierce (e.g., partially or completely transpierce) the protection film 750. Each of the folding holes 771 may extend in the width (the y-axis) direction crossing (e.g., perpendicular to) the longitudinal (the x-axis) direction along which the protection film 750 is folded.

The plurality of folding holes 771 may be wrapped (e.g., partially or completely wrapped) around by a molding unit (or molded portion) 780. The molding unit 780 may be disposed on the plurality of folding holes 771 and adapted to prevent deformation of the protection film 750 due to repeated folding. The molding unit 780 may be molded (e.g., insert-molded) onto the protection film 750 having the folding holes 771 therein. The molding unit 780 may include a material with elasticity, for example, a polymer material such as rubber and plastic or any other suitable material with elastic or resilient characteristics known to those skilled in the art.

The molding unit 780 may, as illustrated in FIG. 8, include a plurality of protrusion units (or protrusions) 790 protruded vertically downward from the protection film 750. Each of the protrusion units 790 may include a bottom portion 791 in contact with the protection film 750, a top portion 792 positioned away from (e.g., far from) the protection film 750, and a side portion 793 connecting the bottom and top portions 791 and 792 to each other. The bottom portion 791 of the protrusion unit 790 may be embedded (e.g., partially or completely embedded) in the folding hole 771.

Each of the protrusion units 790 may have inclined surfaces that avoid causing interference during folding. For example, a cross-section of the protrusion unit 790 may be narrower in a direction away from the bottom portion 791 of the protrusion unit 790 and toward the top portion 792 of the protrusion unit 790 than at the bottom portion 791. The cross-section of the protrusion unit 790 may be a trapezoid according to an embodiment. In an embodiment, the cross-section of the protrusion unit 790 may be a rectangle, a triangle, or other suitable shape.

Because the molding unit 780 having the plurality of protrusion units 790 is molded (e.g., insert-molded) onto the folding hole 771 as described above, deformation of the protection film 750 may be prevented or reduced.

The plurality of folding holes 171 and 771 may be in (e.g., positioned or arranged in) the folding areas 116 and 716, respectively, and arranged with respect to each other in various patterns according to an embodiment.

Figure 9:
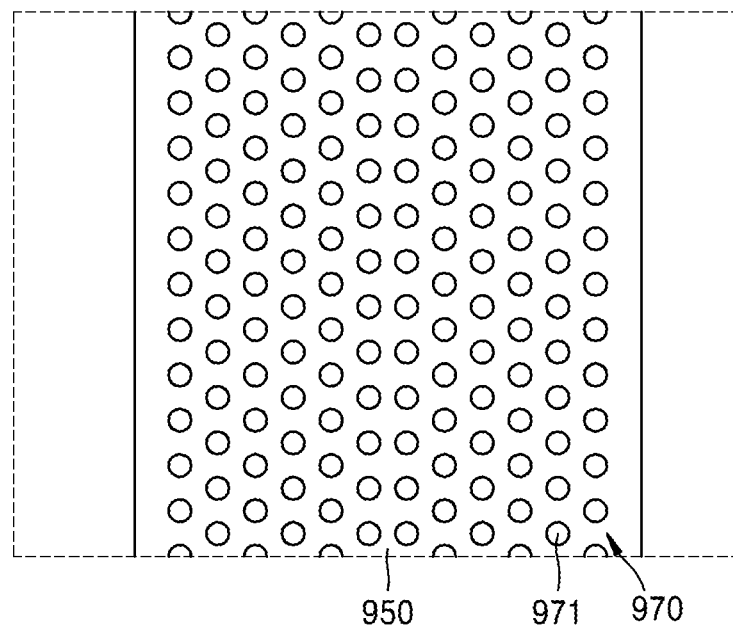
FIG. 9 is an enlarged plan view of a folding area of a protection film according to an embodiment.

Referring to FIG. 9, a protection film 950 may include a folding reinforcement unit 970. The folding reinforcement unit 970 may include a plurality of folding holes 971. Each of the folding holes 971 may be circular, unlike the folding hole 171 in FIG. 5.

Figure 10:
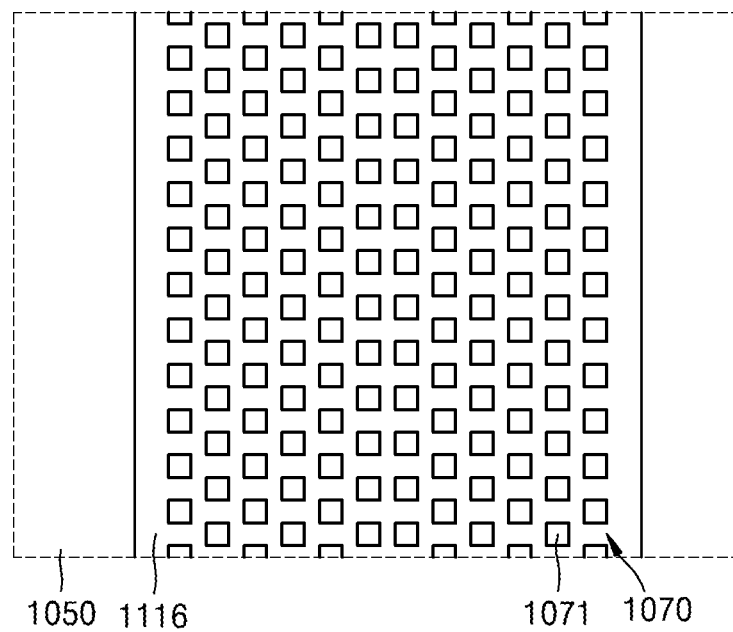
FIG. 10 is an enlarged plan view of a folding area of a protection film according to an embodiment.

Referring to FIG. 10, a protection film 1050 may include a folding reinforcement unit 1070. The folding reinforcement unit 1070 may include a plurality of folding holes 1071. Each of the folding holes 1071 may be rectangular (e.g., square).

The folding hole (e.g., folding hole 171 or 771) in the folding area (e.g., folding area 116 or 716) is not limited to any one of circular, elliptical, wavy, and rectangular shapes according to an embodiment. Rather, other suitable shapes may be employed.

The folding reinforcement unit may not be the folding hole according to an embodiment.

Figure 11:
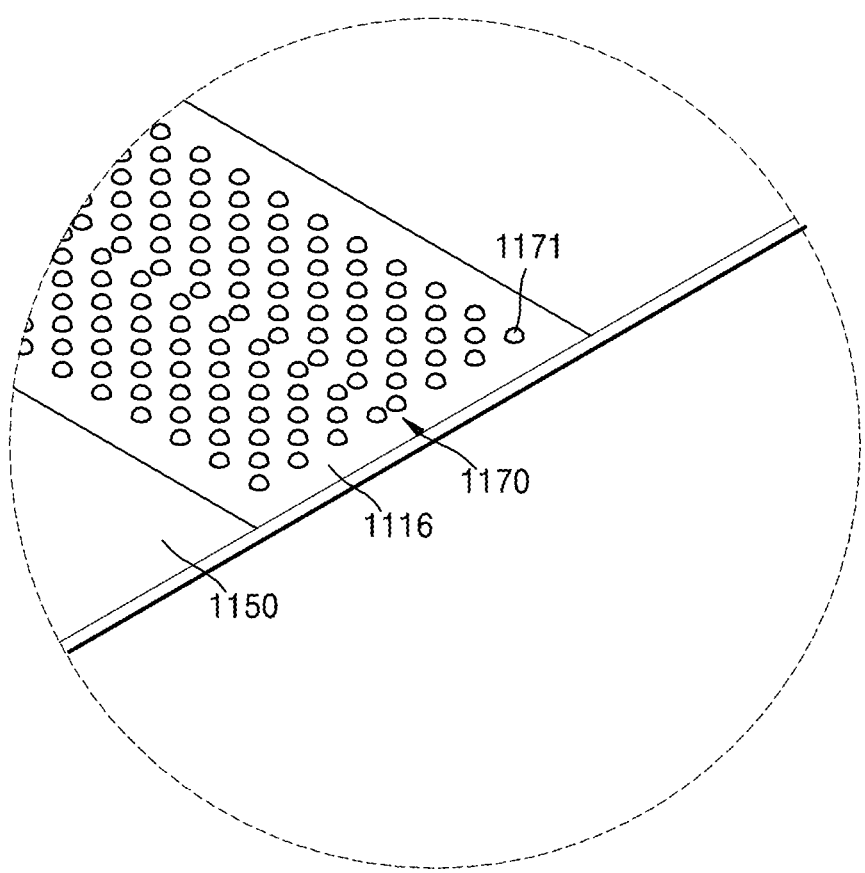
FIG. 11 is an enlarged perspective view of a portion taken from a folding area of a protection film according to an embodiment.

Referring to FIG. 11, a protection film 1150 may include a folding reinforcement unit 1170. The folding reinforcement unit 1170 may not transpierce the protection film 1150, unlike the folding reinforcement unit 170 in FIG. 1, but may include a plurality of dimples (or depressions) 1171 in the folding area 1116 of the protection film 1150.

As long as the folding reinforcement unit 1170 has a structure that reduces a cross-sectional area of the folding area 1116, the structure is not limited to any structure (e.g., an opening or dimple) according to an embodiment.

Figure 12:
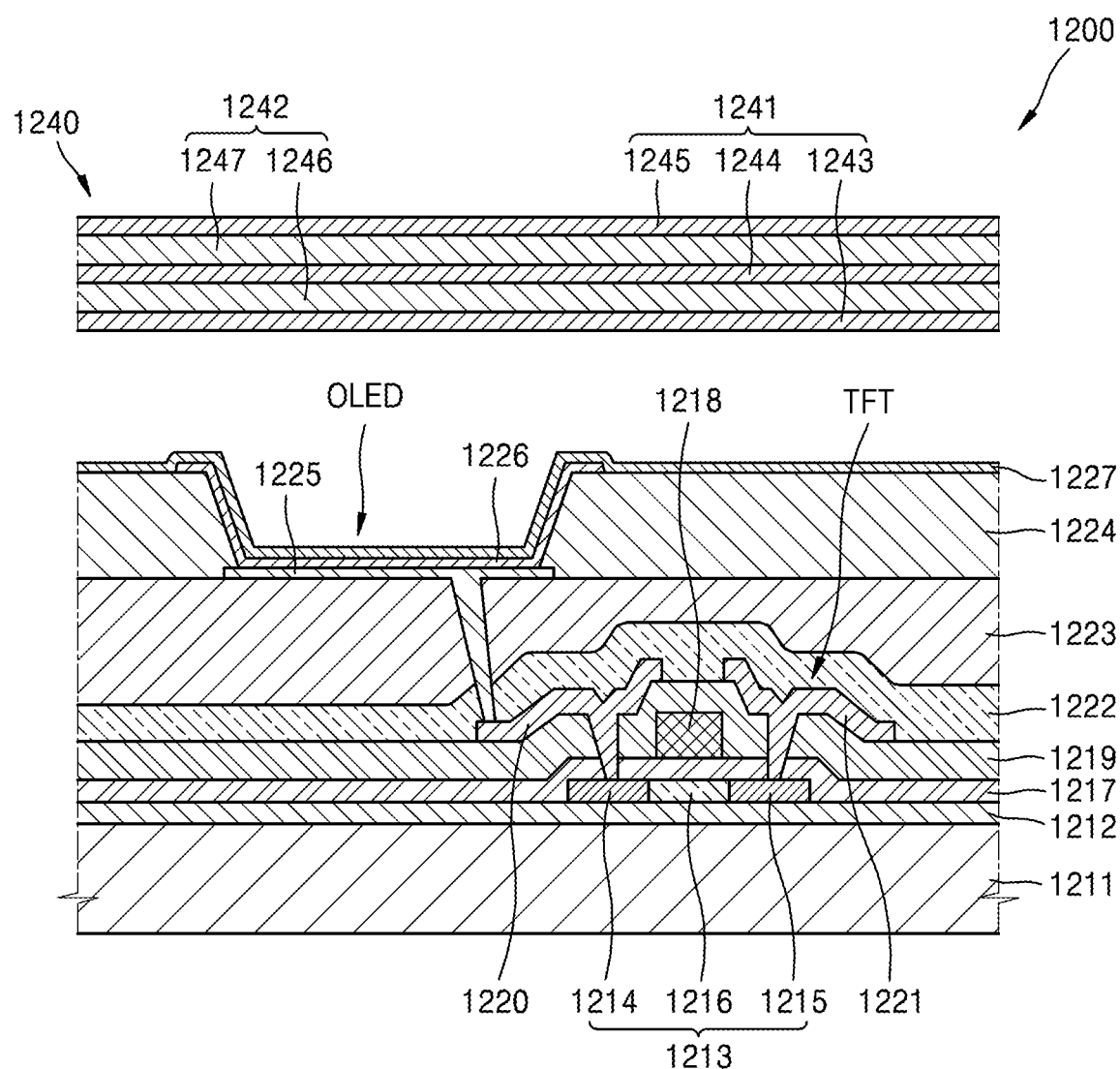
FIG. 12 is a cross-sectional view of a sub-pixel of an organic light emitting display device according to an embodiment.

FIG. 12 is a cross-sectional view of a sub-pixel of an organic light emitting display device 1200 according to an embodiment.

Each of sub-pixels may include at least one TFT and at least one OLED. The structure of the TFT in FIG. 12 is only an example, and the number of TFTs and the structure thereof may be variously modified.

Referring to the drawing in FIG. 12, the organic light emitting display device 1200 may include a display substrate 1211 and a thin film encapsulating layer 1240 disposed on the display substrate 1211.

The display substrate 1211 may be a flexible glass substrate, a flexible polymer substrate, or a combination thereof. The display substrate 1211 may be transparent, semi-transparent, opaque, or a combination thereof.

A buffer layer 1212 may be on (e.g., arranged or positioned on) the display substrate 1211. The buffer layer 1212 may cover (e.g., entirely cover) a top surface of the display substrate 1211. The buffer layer 1212 may include an inorganic material, an organic material, or a combination thereof. The buffer layer 1212 may be a single layer or a multi-layer.

The TFT may be disposed on (or arranged or positioned on) the buffer layer 1212. The TFT is described as a top gate transistor according to an embodiment; however, TFTs with other suitable structures such as a bottom gate transistor may be included.

A semiconductor activation layer 1213 may be disposed on the buffer layer 1212.

The semiconductor activation layer 1213 may include a source region 1214 and a drain region 1215 which are formed or disposed via doping impure ions of N type or P type. A region between the source region 1214 and the drain region 1215 may be a region 1216 (e.g., a channel region) where impurities are not doped. The semiconductor activation layer 1213 may be an organic semiconductor, an inorganic semiconductor, amorphous silicon, or a combination thereof. The semiconductor activation layer 1213 may be an oxide semiconductor according to an embodiment.

A gate insulating layer 1217 may be on (e.g., deposited onto) the semiconductor activation layer 1213. The gate insulating layer 1217 may include an inorganic layer. The gate insulating layer 1217 may be a single layer or a multi-layer.

A gate electrode 1218 may be on the gate insulating layer 1217. The gate electrode 1218 may include materials with high conductivity. The gate electrode 1218 may be a single layer or a multi-layer.

An intermediate insulating layer (or interlayer insulating layer) 1219 may be on the gate electrode 1218. The intermediate insulating layer 1219 may include an inorganic layer, an organic layer, or a combination thereof.

A source electrode 1220 and a drain electrode 1221 may be disposed on the interlayer insulating layer 1219. In an embodiment, contact holes (not illustrated) may be formed via selectively removing portions of (e.g., partially removing) the gate insulating layer 1217 and the interlayer insulating layer 1219. Through contact holes, the source electrode 1220 may be electrically connected to the source region 1214 and the drain electrode 1221 may be electrically connected to the drain region 1215.

A passivation layer 1222 may be disposed on the source electrode 1220 and the drain electrode 1221. The passivation layer 1222 may include an inorganic layer or an organic layer of acryl or any other suitable material known to those skilled in the art. A planarization layer 1223 may be disposed on the passivation layer 1222. Any one of the passivation layer 1222 and the planarization layer 1223 may be omitted.

The TFT may be electrically connected to the OLED.

The OLED may be disposed on the planarization layer 1223. The OLED may include a first electrode 1225, the intermediate layer 1226, and a second electrode 1227.

The first electrode 1225 may function as an anode and may include various conducting materials. The first electrode 1225 may include a transparent electrode or a reflective-type electrode. The first electrode 1225 may include a transparent conducting layer such as ITO, IZO, ZnO and $IN_2O_3$, a metal layer such as Ag, Mg, Al, Pt, Pd, Au, Ni, Nd, Ir and Cr, and/or a combination thereof (e.g., a compound of such materials).

A pixel define layer 1224 may be disposed on the planarization layer 1223. The pixel define layer 1224 may cover a portion of the first electrode 1225. In an embodiment, the pixel define layer 1224 may define a light emitting region of respective sub-pixels via surrounding one or more edges of the first electrode 1225. The first electrode 1225 may be patterned with respect to each sub-pixel.

The pixel define layer 1224 may include an organic layer, an inorganic layer, or a combination thereof. The pixel define layer 1224 may include a single layer or a multi-layer.

An intermediate layer 1226 may be formed, on the first electrode 1225, in an exposed region via etching a portion of the pixel define layer 1224. The intermediate layer 1226 may be formed via a deposition process.

The intermediate layer 1226 may be equipped with an organic emissive layer.

In an embodiment, the intermediate layer 1226 may be equipped with the organic emissive layer and additionally, at least one selected from the group consisting of a hole injection layer (HIL), a hole transport layer (HTL), an electron transport layer (ETL), an electron injection layer (EIL), and combinations thereof. However, embodiments of the present inventive concept are not limited thereto, and the intermediate layer 1226 may be equipped with the organic emissive layer and may be further equipped with various functional layers that are known to those skilled in the art.

The second electrode 1227 may be disposed on the intermediate layer 1226.

The second electrode 1227 may function as a cathode. The second electrode 1227 may include a transparent electrode or a reflective-type electrode. The second electrode 1227 may include a transparent conducting layer such as ITO, IZO, ZnO and $In_2O_3$, a metal layer including metals with small work function such as Li, Ca, LiF/Ca, LiF/Al, Al and Mg, and/or a combination thereof (e.g., a compound of such materials).

In an embodiment, the plurality of sub-pixels may be disposed on the display substrate 1211. For example, red, green, blue or white color with respect to each sub-pixel may be realized; however, the present disclosure is not limited thereto.

The thin film encapsulation layer 1240 may cover the OLED. The thin film encapsulation layer 1240 may have an inorganic layer 1241 and an organic layer 1242 alternately stacked. For example, the inorganic layer 1241 may include a first inorganic layer 1243, a second inorganic layer 1244, and a third inorganic layer 1245. The organic layer 1242 may include a first organic layer 1246 and a second organic layer 1247. However, the present invention is not limited thereto, and the thin film encapsulation layer 1240 may include more or fewer organic layers and/or inorganic layers.

As described above, the flexible display device of the present disclosure may reduce the bending rigidity via attaching the folding reinforcement unit (e.g., the reinforcement unit 170 illustrated in FIGS. 3 through 6) to the protection film (e.g., the protection film 150 illustrated in FIGS. 1 and 3 through 5).

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been illustrated and described with reference to the figures, it will be understood by those of ordinary skill in the art that various changes in form and details may be made therein without departing from the spirit and scope of the inventive concept as defined by the following claims and their equivalents.

What is claimed is:

1. A flexible display device comprising:
 a flexible display panel having a folding area adapted to be folded with respect to an imaginary folding line extending across the flexible display panel in a first direction, the flexible display panel comprising a display substrate and a thin film encapsulation layer, the display substrate having a first surface and a second surface opposite to the first surface, the thin film encapsulation layer being on the first surface of the display substrate;
 a driver electrically connected to the flexible display panel;
 a protection film on the folding area of the flexible display panel, the protection film having a first surface facing the flexible display panel and a second surface opposite to the first surface; and
 a folding reinforcer on the protection film in an area of the folding area and having one or more discontinuous portions,
 wherein the one or more discontinuous portions are separated by a plurality of folding openings transpierce the folding reinforcer in the folding area,
 wherein the protection film is separate from the display substrate in a vertical direction, the folding reinforcer being on a first area of the protection film and not being on a second area of the protection film, the second area of the protection film contacting the second surface of the display substrate,
 wherein the flexible display panel comprises an outwardly-foldable display panel configured to display an image toward the outside of the flexible display panel when the flexible display panel is folded,
 wherein the protection film is disposed on the second surface of the display substrate corresponding to an inside surface of the flexible display panel to be folded,
 wherein the plurality of folding openings comprise:
  a plurality of first folding openings separated from each other along a second direction crossing the first direction; and
  a plurality of second folding openings that are each between every two adjacent ones of the first folding openings in the second direction,
 wherein the plurality of first folding openings and the plurality of second folding openings are alternately arranged with respect to each other, and
 wherein two of the first folding openings are directly adjacent each other along their entire lengths in the first direction at a center of the folding area.

2. The flexible display device of claim 1, wherein the plurality of folding openings transpierce the protection film.

3. The flexible display device of claim 2, wherein each of the folding openings extends in the first direction.

4. The flexible display device of claim 3, wherein each of the folding openings has a strip shape.

5. The flexible display device of claim 4, wherein at least one edge of each folding opening is rounded.

6. The flexible display device of claim 1, wherein the folding openings are wrapped around by a molded portion.

7. The flexible display device of claim 6, wherein the molded portion is insert-molded onto the protection film having the folding openings therein.

8. The flexible display device of claim 6, wherein the molded portion comprises a polymer.

9. The flexible display device of claim 1, wherein each of the folding openings is circular, elliptical, wavy, or rectangular.

10. The flexible display device of claim 1, wherein the protection film comprises a metal film.

11. The flexible display device of claim 1, wherein the flexible display panel further comprises an active area adapted to display an image and an inactive area that outwardly extends from the active area.

12. A flexible display device comprising:
a flexible display panel having a folding area adapted to be folded with respect to an imaginary folding line extending across the flexible display panel in a first direction;
a driver electrically connected to the flexible display panel;
a protection film on the folding area of the flexible display panel, the protection film having a first surface facing the flexible display panel and a second surface opposite to the first surface; and
a folding reinforcer on the protection film in an area of the folding area having one or more discontinuous portions, the one or more discontinuous portions being separated by a plurality of folding openings in the folding area, the folding openings being wrapped around by a molded portion, the molded portion being insert-molded onto the protection film having the folding openings therein and comprising a plurality of protrusions that protrude from the protection film.

13. The flexible display device of claim 12, wherein each protrusion comprises:
a bottom portion contacting the protection film and at least partially embedded in the folding opening;
a top portion arranged away from the protection film; and
a side portion connecting the bottom and top portions to each other.

14. The flexible display device of claim 13, wherein a side surface of each protrusion comprises an inclined surface.

15. The flexible display device of claim 14, wherein a cross-section of the protrusion is narrower in a direction away from the bottom portion contacting the protection film than at the bottom portion.

* * * * *